(12) United States Patent
Fujisawa

(10) Patent No.: US 9,047,986 B2
(45) Date of Patent: Jun. 2, 2015

(54) OUTPUT CIRCUIT FOR SEMICONDUCTOR DEVICE, SEMICONDUCTOR DEVICE HAVING OUTPUT CIRCUIT, AND METHOD OF ADJUSTING CHARACTERISTICS OF OUTPUT CIRCUIT

(75) Inventor: Hiroki Fujisawa, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 23 days.

(21) Appl. No.: 13/468,691

(22) Filed: May 10, 2012

(65) Prior Publication Data

US 2012/0217992 A1 Aug. 30, 2012

Related U.S. Application Data

(60) Continuation of application No. 12/883,563, filed on Sep. 16, 2010, now Pat. No. 8,198,911, which is a continuation of application No. 12/364,296, filed on Feb. 2, 2009, now Pat. No. 7,808,270, which is a (Continued)

(30) Foreign Application Priority Data

Jan. 19, 2005 (JP) .................................. 2005-011272

(51) Int. Cl.
*G11C 29/02* (2006.01)
*H03K 17/16* (2006.01)
*H03K 19/003* (2006.01)
(Continued)

(52) U.S. Cl.
CPC .......... *G11C 29/02* (2013.01); *G01R 31/31713* (2013.01); *G11C 29/022* (2013.01); *G11C 29/028* (2013.01); *G11C 29/50008* (2013.01)

(58) Field of Classification Search
USPC .......................................................... 326/30
See application file for complete search history.

(56) References Cited

U.S. PATENT DOCUMENTS 4,922,135 A 5/1990 Mollier et al.
5,371,457 A 12/1994 Lipp
(Continued)

FOREIGN PATENT DOCUMENTS

JP 07-142985 6/1995
JP 08-032435 2/1996
(Continued)

OTHER PUBLICATIONS

Japanese Office Action, with English translation, issued in Japanese Patent Application No. JP 2005-011272, mailed Dec. 4, 2007.

(Continued)

*Primary Examiner* — Dylan White

(57) ABSTRACT

To decrease the circuit scale necessary for the calibration of the output circuit and to decrease the time required for the calibration operation. The invention includes a first output buffer and a second output buffer that are connected to a data pin, and a calibration circuit that is connected to a calibration pin. The first output buffer and the second output buffer include plural unit buffers. The unit buffers have mutually the same circuit structures. With this arrangement, the impedances of the first output buffer and the second output buffer can be set in common, based on the calibration operation using the calibration circuit. Consequently, both the circuit scale necessary for the calibration operation and the time required for the calibration operation can be decreased.

7 Claims, 9 Drawing Sheets

Related U.S. Application Data division of application No. 11/783,787, filed on Apr. 12, 2007, now Pat. No. 7,495,453, which is a division of application No. 11/327,425, filed on Jan. 9, 2006, now Pat. No. 7,215,128.

(51) Int. Cl.
  *G01R 31/317* (2006.01)
  *G11C 29/50* (2006.01)

(56) References Cited

U.S. PATENT DOCUMENTS

| | | | |
|---|---|---|---|
| 5,517,142 | A | 5/1996 | Jang et al. |
| 5,675,824 | A | 10/1997 | Steele |
| 5,754,480 | A | 5/1998 | Sato |
| 5,774,544 | A | 6/1998 | Lee et al. |
| 6,305,005 | B1 | 10/2001 | Burnham |
| 6,347,850 | B1 | 2/2002 | Volk |
| 6,420,899 | B1 | 7/2002 | Crittenden et al. |
| 6,484,293 | B1 | 11/2002 | Starr |
| 6,549,036 | B1 | 4/2003 | Lee |
| 6,836,143 | B2 | 12/2004 | Song |
| 6,839,286 | B2 | 1/2005 | Cho et al. |
| 6,900,691 | B2 | 5/2005 | Furue |
| 6,965,529 | B2 | 11/2005 | Zumkehr et al. |
| 6,980,020 | B2 | 12/2005 | Best et al. |
| 7,038,486 | B2 * | 5/2006 | Aoyama et al. ................ 326/30 |
| 7,148,721 | B2 | 12/2006 | Park |
| 7,170,313 | B2 | 1/2007 | Shin |
| 7,176,729 | B2 | 2/2007 | Hayashi et al. |
| 7,200,235 | B1 | 4/2007 | Trimberger |
| 7,215,128 | B2 | 5/2007 | Fujisawa |
| 7,373,668 | B1 | 5/2008 | Trimberger |
| 7,389,194 | B2 | 6/2008 | Nguyen et al. |
| 7,595,645 | B2 | 9/2009 | Fujisawa et al. |
| 7,808,270 | B2 * | 10/2010 | Fujisawa ........................ 326/30 |
| 7,808,278 | B2 | 10/2010 | Nguyen et al. |
| 8,237,468 | B2 * | 8/2012 | Nguyen et al. ................ 326/82 |
| 2002/0059518 | A1 | 5/2002 | Smeets et al. |
| 2003/0218477 | A1 * | 11/2003 | Jang et al. ...................... 326/30 |
| 2004/0113653 | A1 * | 6/2004 | Lundberg ....................... 326/30 |
| 2005/0071730 | A1 | 3/2005 | Moyer et al. |
| 2005/0289355 | A1 | 12/2005 | Kitariev et al. |
| 2006/0097749 | A1 | 5/2006 | Ahmad et al. |
| 2006/0126401 | A1 | 6/2006 | Ba |
| 2008/0054937 | A1 | 3/2008 | Kinoshita et al. |
| 2010/0141295 | A1 | 6/2010 | Fulks, III |

FOREIGN PATENT DOCUMENTS

| | | |
|---|---|---|
| JP | 10-050070 | 2/1998 |
| JP | 10-224201 | 8/1998 |
| JP | 11-085345 | 3/1999 |
| JP | 2000-031811 | 1/2000 |
| JP | 2000-059202 | 2/2000 |
| JP | 2000-134084 | 5/2000 |
| JP | 2000-209078 | 7/2000 |
| JP | 2001-085986 | 3/2001 |
| JP | 2001-094409 | 4/2001 |
| JP | 2001-168704 | 6/2001 |
| JP | 2002-152032 | 5/2002 |
| JP | 2002-152032 A | 5/2002 |
| JP | 2003-133943 | 5/2003 |
| JP | 2003-133943 A | 5/2003 |
| JP | 2003-347923 | 12/2003 |
| JP | 2004-032070 | 1/2004 |
| JP | 2004-32070 A | 1/2004 |
| JP | 2006-130217 | 5/2006 |

OTHER PUBLICATIONS

Japanese Office Action, with partial English translation, issued in Japanese Patent Application No. 2008-104237, dated Jul. 6, 2010.

* cited by examiner

|  | 151P | 151N | 152P | 152N | 153P | 153N |
|---|---|---|---|---|---|---|
| OUTPUT HIGH LEVEL | Low | Low | Low | Low | Low | Low |
| OUTPUT LOW LEVEL | High | High | High | High | High | High |
| ODT (120Ω) | High | Low | Low | High | High | Low |
| ODT (240Ω) | High | Low | High | Low | Low | High |

FIG.10

OUTPUT CIRCUIT FOR SEMICONDUCTOR DEVICE, SEMICONDUCTOR DEVICE HAVING OUTPUT CIRCUIT, AND METHOD OF ADJUSTING CHARACTERISTICS OF OUTPUT CIRCUIT

RELATED APPLICATIONS

This application is a Continuation of U.S. application Ser. No. 12/883,563, filed on Sep. 16, 2012 now U.S. Pat. No. 8,198,911, which is a Continuation of U.S. application Ser. No. 12/364,296, filed Feb. 2, 2009, now U.S. Pat. No. 7,808,270, which is a Divisional of U.S. application Ser. No. 11/783,787, filed Apr. 12, 2007, now U.S. Pat. No. 7,495,453, which is a Divisional of U.S. application Ser. No. 11/327,425, filed Jan. 9, 2006, now U.S. Pat. No. 7,215,128, and claims priority of Japanese Application No. 2005-011272, filed on Jan. 19, 2005, the entire of each of which are hereby incorporated by reference herein.

TECHNICAL FIELD

The present invention relates to an output circuit for a semiconductor device, and a semiconductor device having this output circuit. Particularly, the invention relates to an output circuit having an output buffer of which impedance can be adjusted, and a semiconductor device having this output circuit. The present invention also relates to a method of adjusting characteristics of an output circuit, and a method of adjusting impedance of an output buffer included in the output circuit.

BACKGROUND OF THE INVENTION

In recent years, a very high data transfer rate is required to transfer data between semiconductor devices, for example, between a CPU and a main memory. In order to achieve this, the amplitude of input and output signals is made smaller each year. When the amplitude of the input and output signals is made smaller, the required precision of the impedance of the output buffer becomes considerably severe. The impedance of the output buffer varies based on process conditions at the manufacturing time. In addition, the impedance is also affected by a change in the ambient temperature and a variation in power supply voltage during the actual usage of the semiconductor device.

Therefore, when a high precision is required for the impedance, an output buffer having the impedance adjusting function is employed (see Japanese Patent Application Laid-open Nos. 2002-152032 and 2004-32070). The adjustment of the impedance of the output buffer is usually carried out using a circuit called a calibration circuit.

On the other hand, when plural chips are connected in parallel on an external bus like a DRAM (Dynamic Random Access Memory), a signal is reflected in some times by a chip of which output buffer is in a high-impedance state (Hi-Z). When the reflection of a signal occurs, the quality of the signal on the external bus is lowered. Therefore, in a semiconductor device in which a high data transfer rate is required like a DDR2 type SDRAM (Synchronous Dynamic Random Access Memory), an ODT (On Die Termination) function for making the output circuit function as a terminal resistor is provided (see Japanese Patent Application Laid-open No. 2003-133943).

When the semiconductor device has the ODT function, a terminal resistor is not necessary on the mother board. Therefore, the number of parts can be decreased, and the reflection of a signal can be prevented effectively. Consequently, the quality of the signal on the external bus can be increased.

However, usually, during the ODT operation, impedance which is different from that during the data output time is required. Therefore, when the output circuit has the ODT function, two calibration circuits for the impedance adjustment are necessary, that is, a calibration circuit that is used to adjust the impedance at the data output time, and a calibration circuit that is used to adjust the impedance at the ODT operation time. This has a problem in that the circuit scale becomes large.

During the calibration operation, the adjustment of the impedance at the data output time and the adjustment of impedance at the ODT operation time need to be carried out separately. Therefore, there is a problem in that it takes time for the calibration. This problem is not so serious when the calibration is carried out at only the power supply on time or the reset time. However, when the calibration is carried out periodically during the actual use time, this problem becomes serious.

SUMMARY OF THE INVENTION

The present invention has been achieved to solve the above problems, and it is an object of the invention to decrease the circuit scale necessary for the calibration operation.

It is another object of the invention to decrease the calibration time.

The above and other objects of the present invention can be accomplished by an output circuit for a semiconductor device, comprising: a first output buffer that is connected to a data pin, and is activated at least at a data output time; a second output buffer that is connected to the data pin, and is activated at least at an ODT operation time; and a calibration circuit that is connected to a calibration pin for controlling impedances of the first output buffer and the second output buffer in common.

It is preferable that each of the first and the second output buffers includes one or parallel-connected two or more unit buffers, and the unit buffers have mutually substantially the same circuit structures. It is further preferable that the calibration circuit includes a replica buffer having substantially the same circuit structure as that of the unit buffer.

The above and other objects of the present invention can also be accomplished by a method of adjusting characteristics of an output circuit having a first output buffer that is activated at least at a data output time and a second output buffer that is activated at least at an ODT operation time, comprising: generating an impedance control signal based on a calibration operation using a calibration circuit; and applying the impedance control signal in common to the first and the second output buffers.

According to the present invention, the impedances of the first and the second output buffers can be set in common based on the calibration operation. Therefore, the calibration circuit that is used to adjust the impedance at the data output time and the calibration circuit that is used to adjust the impedance at the ODT operation time do not need to be provided separately. Consequently, the circuit scale of the calibration circuit can be decreased.

Because the impedance adjustment at the data output time and the impedance adjustment at the CDT operation time can be completed simultaneously in one-time calibration operation, time necessary for the calibration operation can be decreased.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 10 is a table for explaining the operation carried out by the output control circuit.

DETAILED DESCRIPTION OF THE EMBODIMENTS

Preferred embodiments of the present invention will now be explained in detail with reference to the drawings.

Figure 1:
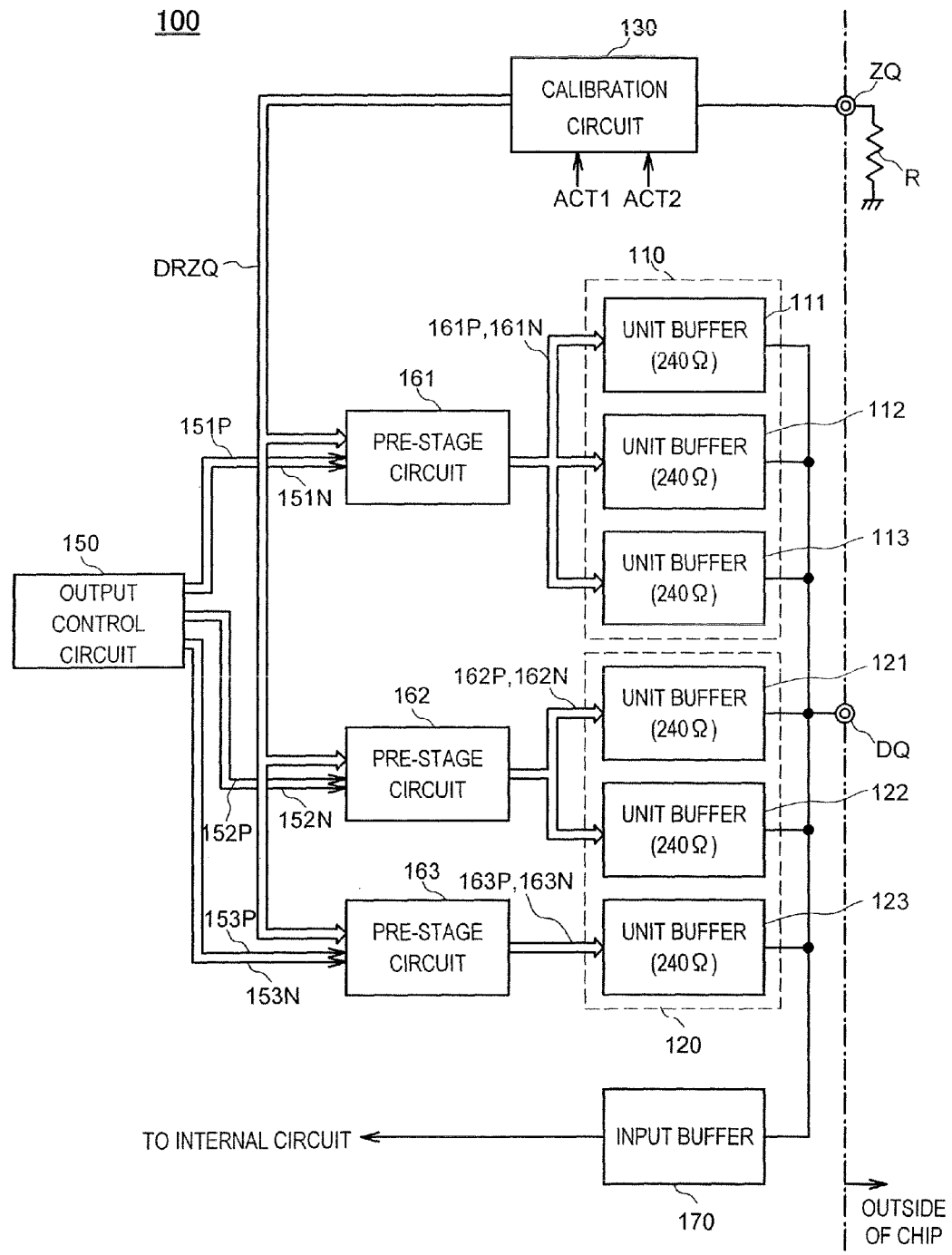
FIG. 1 is a block diagram of a configuration of an output circuit of a semiconductor device according to a preferred embodiment of the present invention.

FIG. 1 is a block diagram of a configuration of an output circuit (an input and output circuit) 100 of a semiconductor device according to a preferred embodiment of the present invention.

As shown in FIG. 1, the output circuit 100 according to the present embodiment includes a first output buffer 110 and a second output buffer 120 that are connected to a data pin DQ, a calibration circuit 130 that is connected to a calibration pin ZQ, and an input buffer 170 that is connected to the data pin DQ.

The output circuit (the input and output circuit) 100 according to this embodiment has the ODT function in addition to the ordinary data input and output function. The ODT function is the function of preventing a reflection of a signal, by making the output circuit function as a terminal resistor, when other semiconductor device is carrying out a data transfer on the external bus connected to the data pin DQ.

In the output circuit 100 according to this embodiment, both the first output buffer 110 and the second output buffer 120 are activated at the data output time, and only the second output buffer 120 is activated at the ODT operation time. In other words, the first output buffer 110 is inactivated at the ODT operation time. While the input buffer 170 is activated at the data input time, details of the configuration and the data input operation of the input buffer 170 are not directly relevant to the gist of the present invention. Therefore, their explanation is omitted from this specification.

As shown in FIG. 1, the first output buffer 110 includes three unit buffers 111 to 113 that are connected in parallel, and the second output buffer 120 includes three unit buffers 121 to 123 that are connected in parallel. These unit buffers 111 to 113 and 121 to 123 have mutually the same circuit structures. For example, in this embodiment, each unit buffer has the impedance of 240Ω (after the adjustment). Therefore, when all the unit buffers 111 to 113 and 121 to 123 are activated, the impedance of the output circuit 100 from the viewpoint of the data pin DQ becomes 40Ω (=240Ω/6).

When only the two unit buffers 121 and 122 are activated out of the three unit buffers 121 to 123 that constitute the second output buffer 120, the impedance of the output circuit 100 from the viewpoint of the data pin DQ becomes 120Ω (=240Ω/2). When only one unit buffer 123 is activated, the impedance of the output circuit 100 from the viewpoint of the data pin DQ becomes 240Ω.

The operation of the unit buffers 111 to 113 is controlled based on operation signals 161P and 161N that are supplied from a pre-stage circuit 161. The operation of the unit buffers 121 to 123 is controlled based on operation signals 162P and 162N that are supplied from a pre-stage circuit 162. The operation of the unit buffer 123 is controlled based on operation signals 163P and 163N that are supplied from a pre-stage circuit 163. As shown in FIG. 1, an impedance control signal DRZQ supplied from a calibration circuit 130 is commonly applied to the pre-stage circuits 161 to 163.

Figure 2:
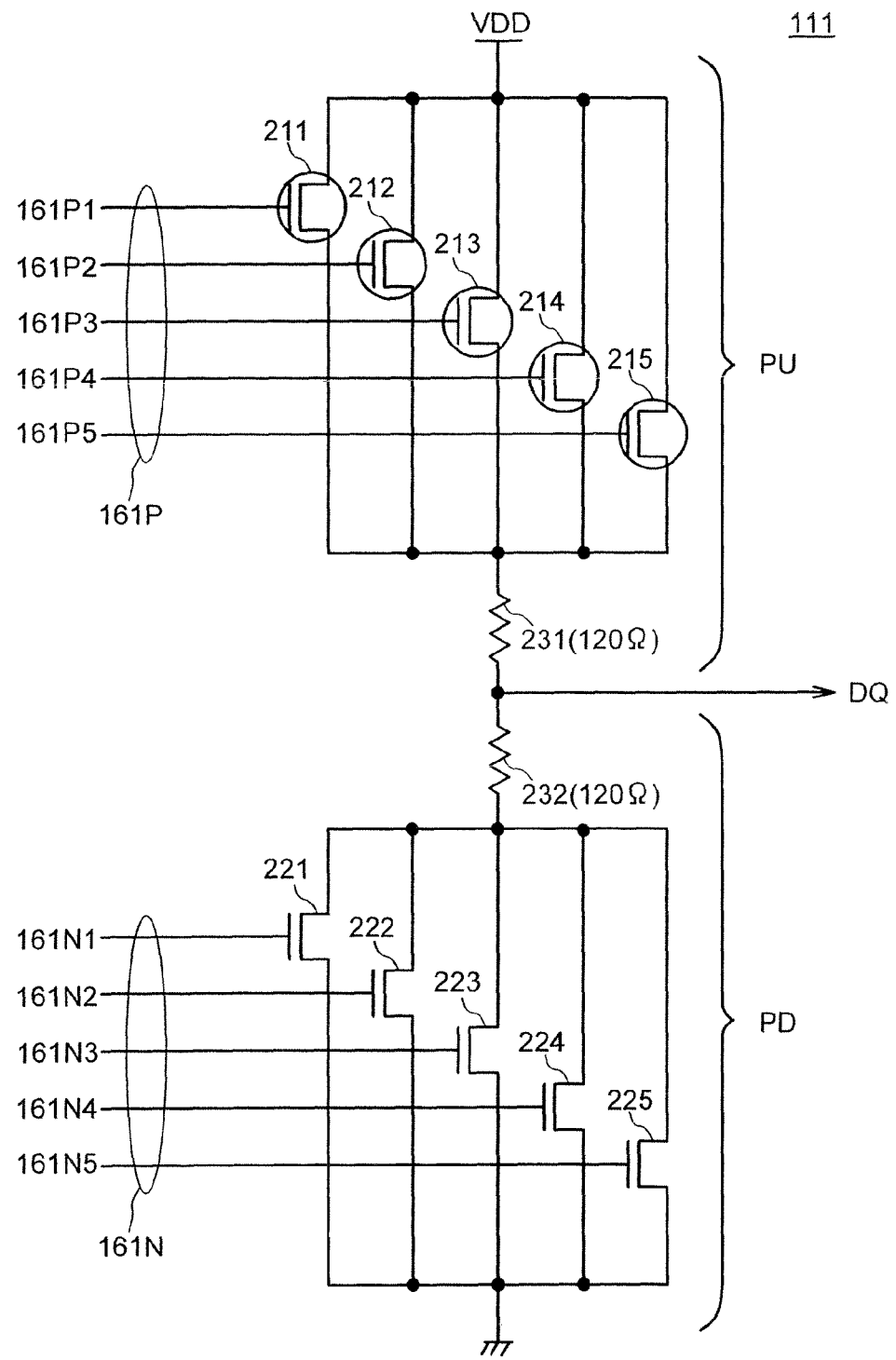
FIG. 2 is a circuit diagram of the unit buffer.

FIG. 2 is a circuit diagram of the unit buffer 111.

As shown in FIG. 2, the unit buffer 111 includes plural (five in this embodiment) P-channel MOS transistors 211 to 215 connected in parallel, plural (five in this embodiment) N-channel MOS transistors 221 to 225 connected in parallel, and resistors 231 and 232 that are connected in series between the transistors 211 to 215 and the transistors 221 to 225. A contact point between the resistor 231 and the resistor 232 is connected to the data pin DQ. Of the unit buffer 111, a part including the P-channel MOS transistors 211 to 215 and the resistor 231 constitutes a pull-up circuit PU. A part including the N-channel MOS transistors 221 to 225 and the resistor 232 constitutes a pull-down circuit PD.

Five operation signals 161P1 to 161P5 that constitute the operation signal 161P are supplied to the gates of the transistors 211 to 215. Five operation signals 161N1 to 161N5 that constitute the operation signal 161N are supplied to the gates of the transistors 221 to 225. Based on this arrangement, the ten transistors that are included in the unit buffer 111 can be individually on/off controlled based on the ten operation signals including the operation signals 161P1 to 161P5 and the operation signals 161N1 to 161N5.

The parallel circuit including the transistors 211 to 215, and the parallel circuit including the transistors 221 to 225 are designed to have resistance of 120Ω during the conduction time.

However, the on resistance of the transistors varies depending on manufacturing conditions, and also varies depending on the ambient temperature and the power supply voltage during the operation. Therefore, desired impedance is not always obtained. In order to set 120Ω to the impedance, the number of transistors to be turned on needs to be adjusted. For this purpose, the parallel circuits including plural transistors are used.

In order to adjust the impedance finely and in a wide range, it is preferable to mutually differentiate a W/L ratio (a gate width to gate length ratio) of the plural transistors that constitute the parallel circuit. Preferably, weight of the power of two is used. Considering this point, according to this embodiment, when the W/L ratio of the transistor 211 is "1", the W/L ratios of the transistors 212 to 215 are set to "2", "4", "8", and "16", respectively (The values of the W/L ratios are relative values, and do not represent actual W/L ratios. This similarly applies to the following explanations). By suitably selecting the transistors to be turned on based on the operation signals 161P1 to 161P5 and the operation signals 161N1 to 161N5, the on resistance of the parallel circuit can be fixed to substantially 120Ω, regardless of the variation due to the manufacturing conditions and a temperature change.

The resistances of the resistors 231 and 232 are set to 120Ω, respectively. With this arrangement, when at least one of the parallel circuit including the transistors 211 to 215 and the parallel circuit including the transistors 221 to 225 is in the on state, the impedance of the unit buffer 111 from the viewpoint of the data pin DQ becomes 240Ω. A tungsten (W) resistor can be used for the resistors 231 and 232.

Other unit buffers 112 and 113 that constitute the first output buffer 110 also have circuit structures that are the same as that of the unit buffer 111 shown in FIG. 2, and are controlled by the same operation signals 161P1 to 161P5 and the operation signals 161N1 to 161N5. On the other hand, other unit buffers 121 to 123 that constitute the second output buffer 120 have the same circuit structures as that of the unit buffer 111 shown in FIG. 2. However, the operations of the unit buffers 121 and 122 are controlled by the operation signals 162P and 162N, and the operation of the unit buffer 123 is controlled based on the operation signals 163P and 163N. The operation signals 162P, 162, 163P, and 163N also have five operation signals, respectively, and are used to control the corresponding pull-up circuit UP or the pull-down circuit PD.

Figure 3:
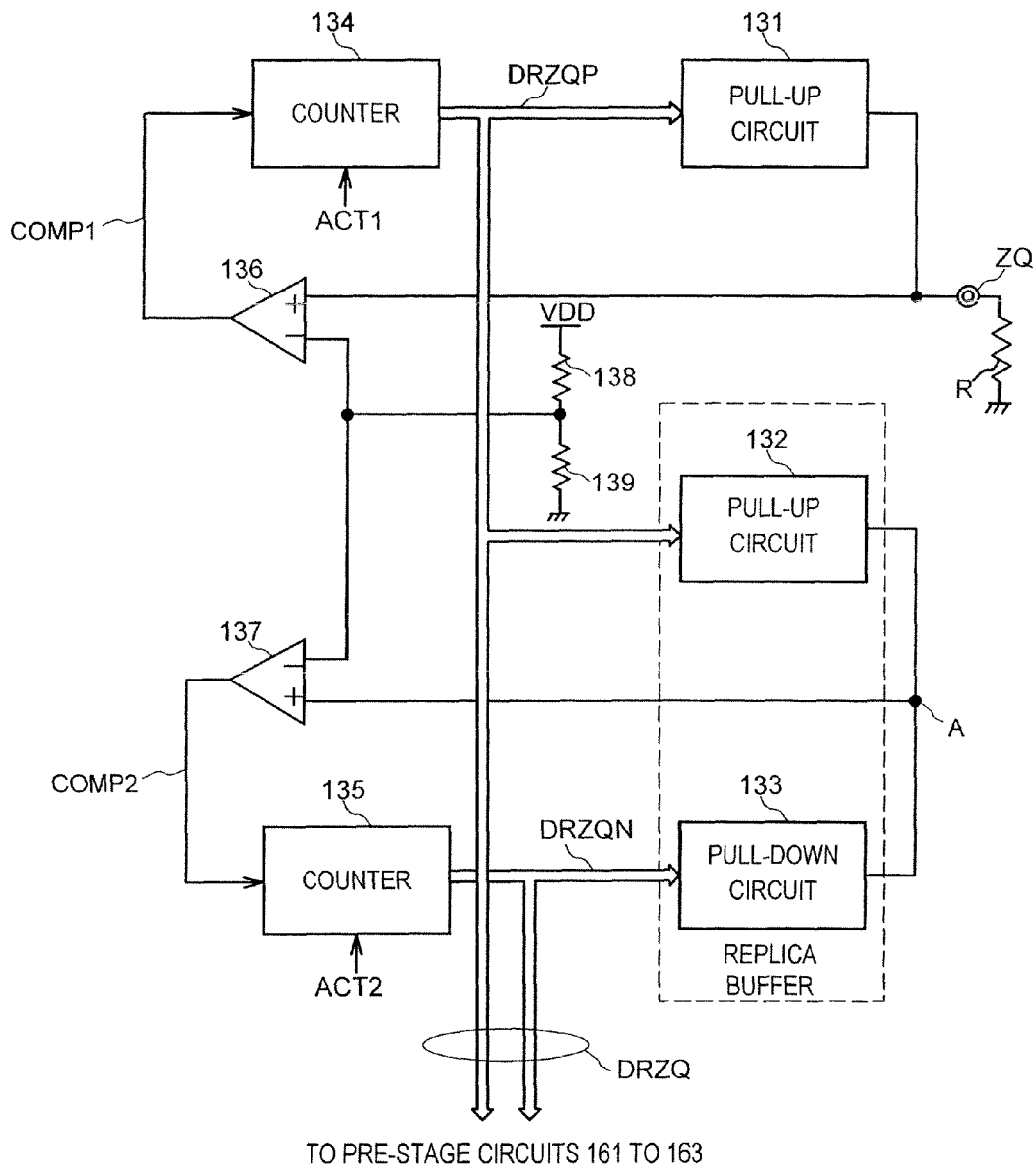
FIG. 3 is a circuit diagram of the calibration circuit.

FIG. 3 is a circuit diagram of the calibration circuit 130.

As shown in FIG. 3, the calibration circuit 130 includes pull-up circuits 131 and 132, a pull-down circuit 133, a counter 134 that controls the operation of the pull-up circuits 131 and 132, a counter 135 that controls the operation of the pull-down circuit 133, a comparator 136 that controls the counter 134, and a comparator 137 that controls the counter 135.

Figure 4:
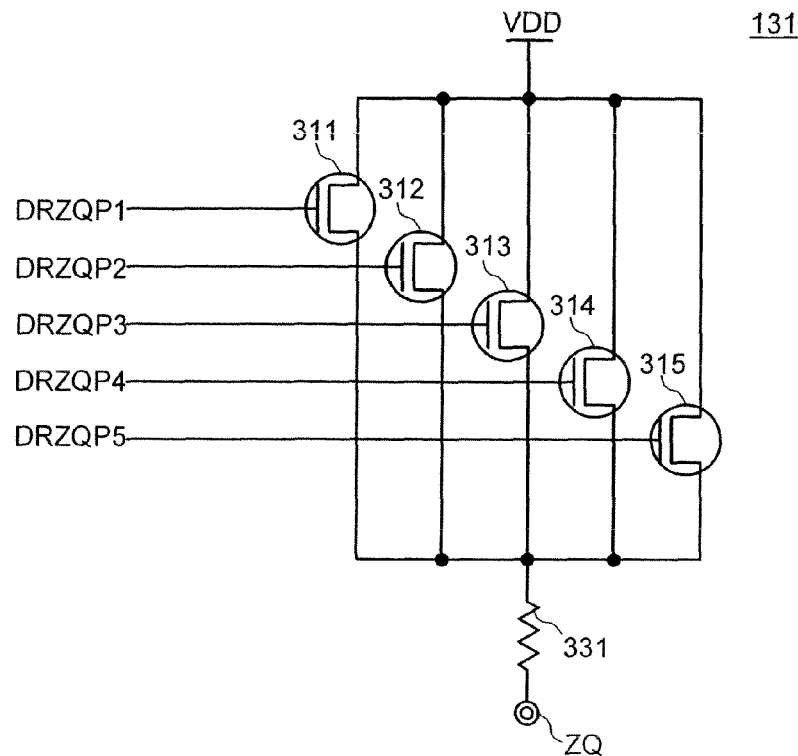
FIG. 4 is a circuit diagram of the pull-up circuit.

FIG. 4 is a circuit diagram of the pull-up circuit 131.

As shown in FIG. 4, the pull-up circuit 131 has a circuit structure substantially the same as that of the pull-up circuit PU included in the unit buffers 111 to 113 and 121 to 123, respectively. In other words, the pull-up circuit 131 includes five P-channel MOS transistors 311 to 315 that are connected in parallel, and a resistor 331 of which one end is connected to drains of these transistors. The other end of the resistor 331 is connected to a calibration pin ZQ.

The transistors 311 to 315 included in the pull-up circuit 131 correspond to the transistors 211 to 215 shown in FIG. 2, and have the same impedance, respectively. Therefore, like the W/L ratios of the transistors 211 to 215, the W/L ratios of the transistors 311 to 315 are also set to "1", "2", "4", "8", and "16", respectively. However, so long as the impedances are substantially the same, the transistor sizes of the transistors 311 to 315 included in the pull-up circuit 131 do not need to be exactly the same as the transistor sizes of the transistors 211 to 215 shown in FIG. 2, and shrunk transistors can be also used.

The resistor 331 also corresponds to the resistor 231 shown in FIG. 2. Therefore, resistance of the resistor 331 is also set to 120Ω.

The counter 134 supplies impedance control signals DRZQP1 to DRZQP5 to the gates of the transistors 311 to 315, respectively, thereby controlling the operation of the pull-up circuit 131. The impedance control signals DRZQP1 to DRZQP5 correspond to the operation signals 161P1 to 161P5.

The pull-up circuit 132 also has the same circuit structure as that of the pull-up circuit 131 shown in FIG. 4. The impedance control signals DRZQP1 to DRZQP5 are also supplied to the gates of the five transistors included in the pull-up circuit 132.

Figure 5:
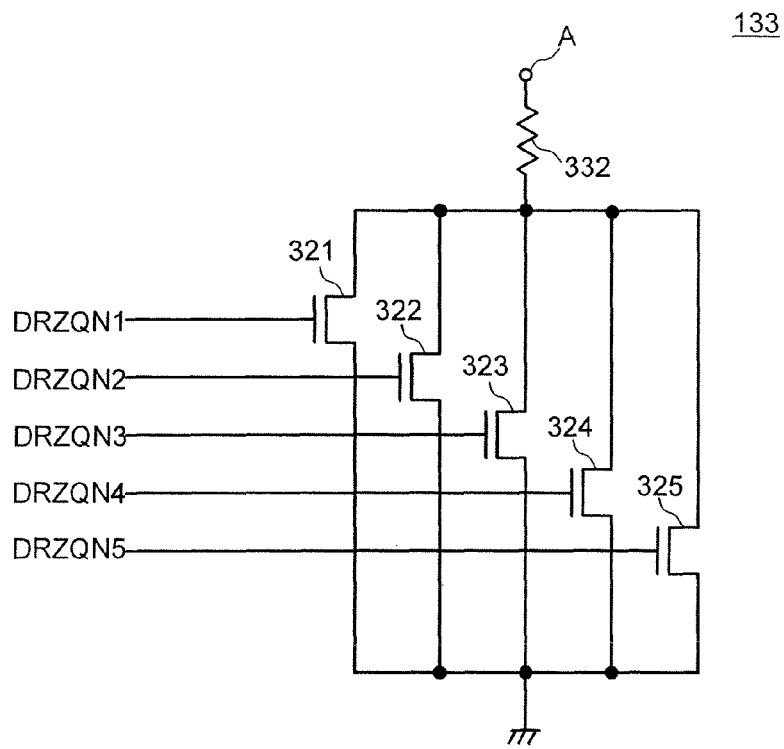
FIG. 5 is a circuit diagram of the pull-down circuit.

FIG. 5 is a circuit diagram of the pull-down circuit 133.

As shown in FIG. 5, the pull-down circuit 133 has a circuit structure substantially the same as that of the pull-down circuit PD included in the unit buffers 111 to 113 and 121 to 123, respectively. In other words, the pull-down circuit 133 includes five N-channel MOS transistors 321 to 325 that are connected in parallel, and a resistor 332 of which one end is connected to drains of these transistors.

The transistors 321 to 325 included in the pull-down circuit 133 correspond to the transistors 221 to 225 shown in FIG. 2, and have the same impedance, respectively. The configuration of the pull-down circuit 133 is similar to that of the pull-up circuit 131, in this respect. The resistor 332 also corresponds to the resistor 232 shown in FIG. 2. Therefore, resistance of the resistor 332 is also set to 120Ω.

The counter 135 supplies imp dance control signals DRZQN1 to DRZQN5 to the gates of the transistors 321 to 325, respectively, thereby controlling the operation of the pull-down circuit 133. The impedance control signals DRZQN1 to DRZQN5 correspond to the operation signals 161N1 to 161N5.

As explained above, the pull-up circuits 131 and 132 have substantially the same circuit structures as that of the pull-up circuit PU included in the unit buffers 111 to 113 and 121 to 123, respectively. The pull-down circuit 133 has substantially the same circuit structure as that of the pull-down circuit PD included in the unit buffers 111 to 113 and 121 to 123, respectively.

Therefore, the impedances of the pull-up circuits 131 and 132 and the pull-down circuit 133 are all 240Ω after the adjustment. Among these circuits, the pull-up circuit 132 and the pull-down circuit 133 constitute a "replica buffer", respectively. Therefore, the replica buffer has substantially the same circuit structure as those of the unit buffers 111 to 113 and 121 to 123. That the replica buffer has "substantially the same" circuit structure means that the transistors included in the replica buffers are regarded the same when they are shrunk. A contact A as the output end of the replica buffer is connected to a non-inverted input terminal (+) of the comparator 137, as shown in FIG. 3.

The counter 134 counts up or counts down when a control signal ACT1 is activated. When a comparison signal COMP1 that is output from the comparator 136 is at a high level, the counter 134 continues counting up, and when the signal COMP1 is at a low level, the counter 134 continues counting down. A noninverted input terminal (+) of the comparator 136 is connected to the calibration pin ZQ, and a noninverted input terminal (−) is connected to an intermediate point between the resistors 138 and 139 that is connected to a power supply potential (VDD) and a ground potential (GND).

Based on this structure, the comparator 136 compares the potential of the calibration pin ZQ with the intermediate voltage (VDD/2). When the former potential is higher, the output comparison signal COMP1 is set to a high level. When the latter potential is higher, the comparison signal COMP1 is set to a low level.

On the other hand, the counter 135 counts up or counts down when a control signal ACT2 is activated. When a comparison signal COMP2 that is output from the comparator 137 is at a high level, the counter 135 continues counting up, and when the signal COMP2 is at a low level, the counter 135 continues counting down. A non-inverted input terminal (+) of the comparator 137 is connected to a contact point A as the output end of the replica buffer, and a non-inverted input terminal (−) is connected to an intermediate point between the resistors 138 and 139.

Based on this structure, the comparator 137 compares the output potential of the replica buffer with the intermediate voltage (VDD/2). When the former potential is higher, the output comparison signal COMP2 is set to a high level. When the latter potential is higher, the comparison signal COMP2 is set to a low level.

When the control signals ACT1 and ACT2 are inactivated, the counters 134 and 135 stop the count operation, and hold the current count value. As described above, the count value of the counter 134 is used for the impedance control signal DRZQP, and the count value of the counter 135 is used for the impedance control signal DRZQN. The collective impedance control signal DRZQ is supplied in common to the pre-stage circuits 161 to 163 shown in FIG. 1.

Figure 6:
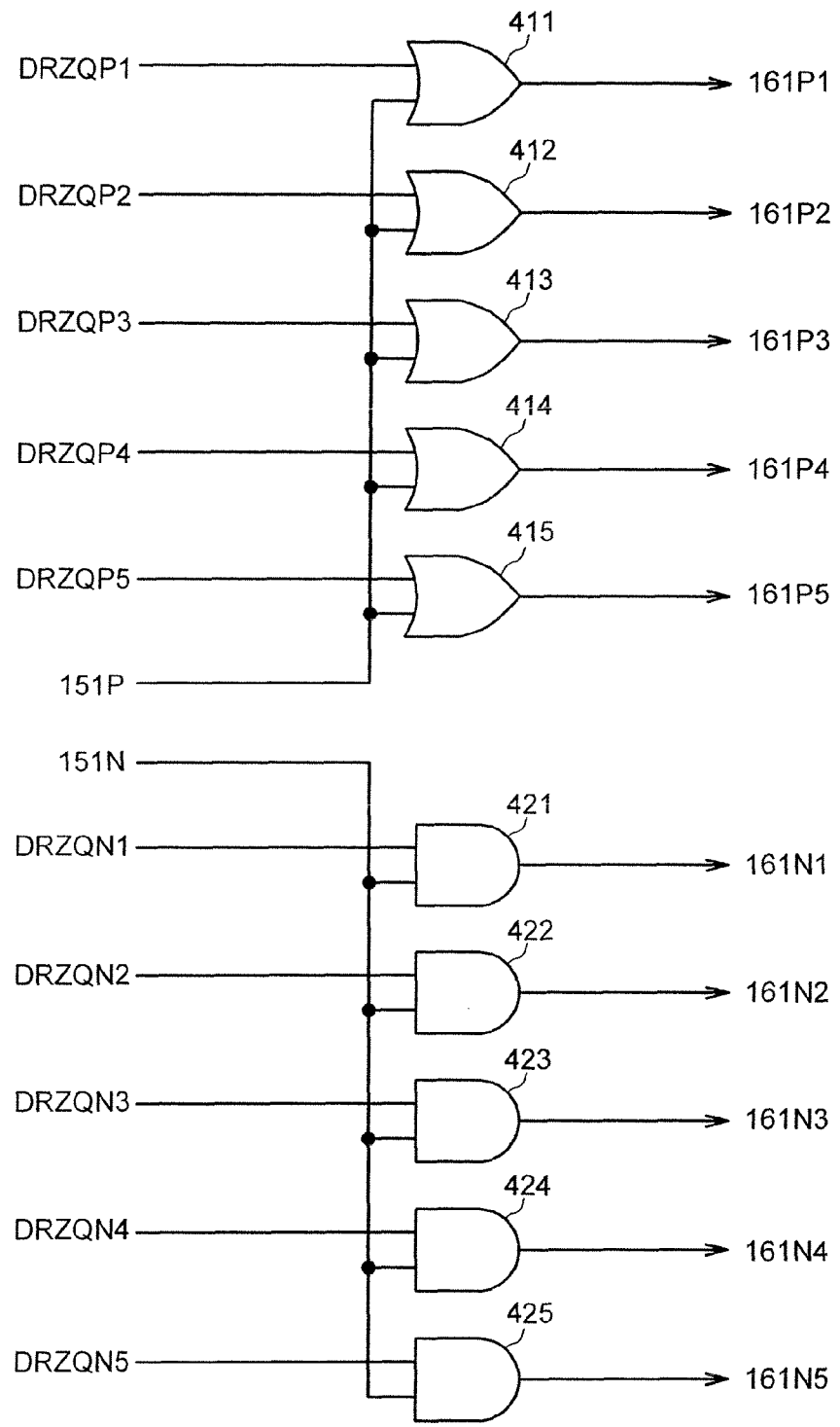
FIG. 6 is a circuit diagram of the pre-stage circuit.

FIG. 6 is a circuit diagram of the pre-stage circuit 161.

As shown in FIG. 6, the pre-stage circuit 161 includes five OR circuits 411 to 415 and five AND circuits 421 to 425. An output control circuit 150 supplies a selection signal 151P in common to the OR circuits 411 to 415, and the calibration circuit 130 supplies the impedance control signals DRZQP1 to DRZQP5 to the OR circuits 411 to 415. On the other hand, the output control circuit 150 supplies the selection signal 151N in common to the AND circuits 421 to 425, and the calibration circuit 130 supplies the impedance control signals DRZQN1 to DRZQN5 to the AND circuits 421 to 425.

The operation signals 161P1 to 161P5 that form the operation signal 161P output from the OR circuits 411 to 415, and the operation signals 161N1 to 161N5 that form the operation signal 161N output from the AND circuits 421 to 425, are supplied in common to the unit buffers 111 to 113, as shown in FIG. 1, thereby controlling the corresponding transistors.

The other pre-stage circuits 162 and 163 also have circuit configurations similar to those of the pre-stage circuit 161 shown in FIG. 6. In this case, the selection signals 152P and 152N from the output control circuit 150 are supplied in common to the OR circuit and the AND circuit respectively that are included in the pre-stage circuit 162. The selection signals 153P and 153N from the output control circuit 150 are supplied in common to the OR circuit and the AND circuit respectively that are included in the pre-stage circuit 163.

The configuration of the output circuit 100 according to this embodiment has been explained above. The operation of the output circuit 100 according to this embodiment is explained next, in the order of the calibration operation, the data output operation, and the ODT operation.

First, the calibration operation will be now explained.

The calibration operation is for adjusting the impedance of the output buffers 110 and 120, as described above. The calibration operation is carried out to correct variations of the impedance due to process conditions at the manufacturing time, and to correct changes of the impedance due to changes in the ambient temperature and variations in the power supply voltage.

Therefore, when high precision is required, it is preferable to periodically execute the calibration operation during the actual operation, instead of carrying out the calibration operation only once at the power supply time or the initialization time such as the resetting time. The output circuit 100 according to this embodiment is particularly effective when the calibration operation is periodically executed during the actual operation as explained above. The calibration operation is explained in detail below.

In executing the calibration operation, first, the external resistor R needs to be connected to the calibration pin ZQ (see FIG. 1 and FIG. 3). The external resistor R needs to have impedance that is the same as the impedance (i.e., the impedance of a replica buffer) required for the unit buffers 111 to 113 and 121 to 123. Therefore, in this embodiment, the external resistor R having 240Ω is used.

Figure 7:
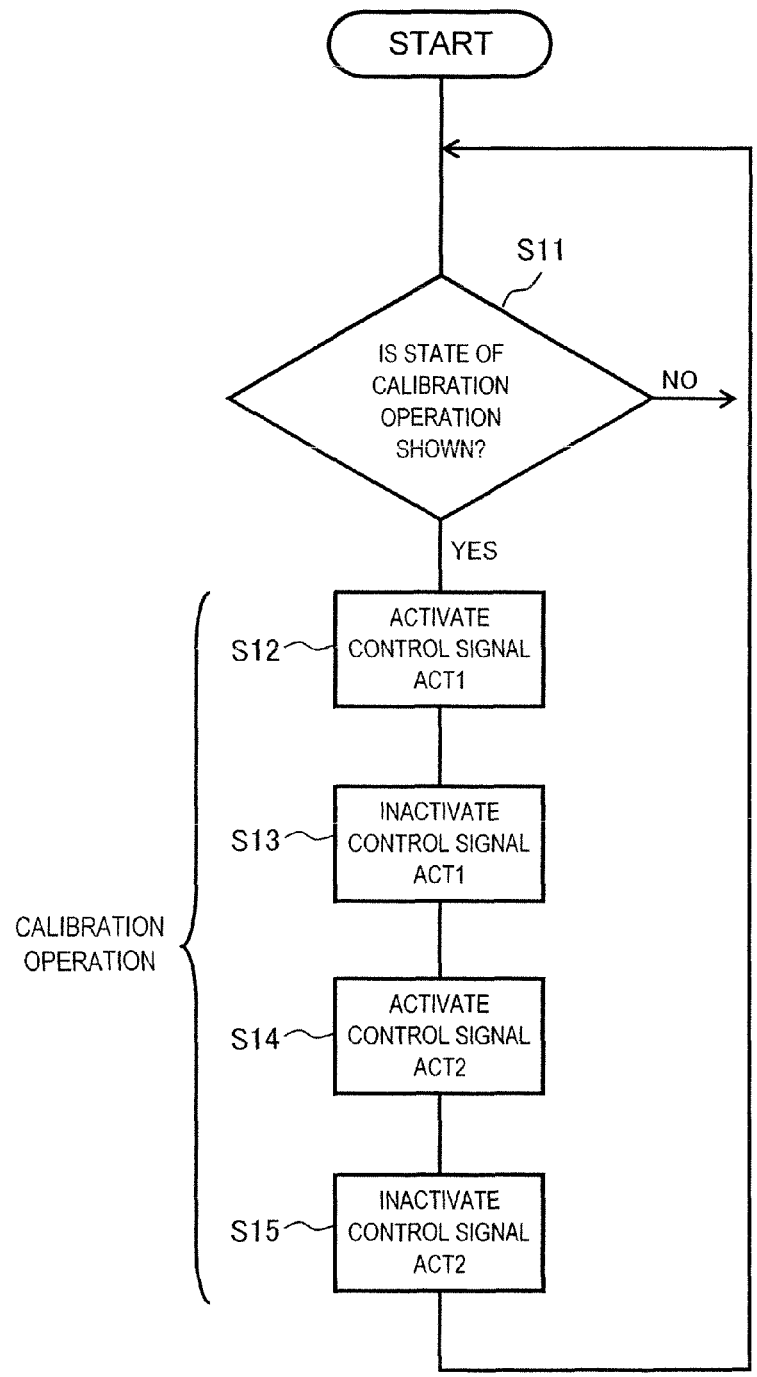
FIG. 7 is a flowchart for explaining the calibration operation.
Figure 8:
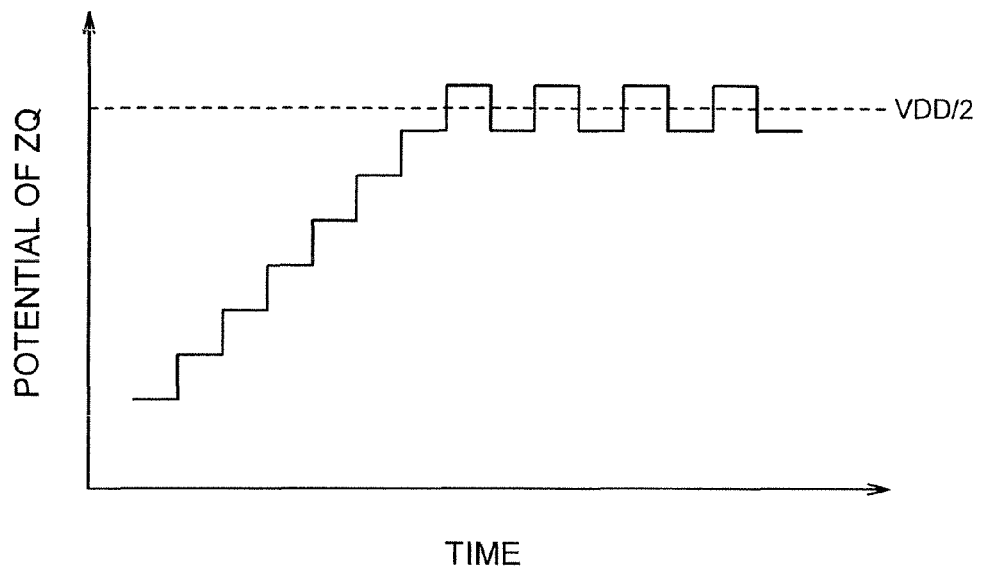
FIG. 8 is a graph showing a change of potential at the calibration pin during the calibration operation.

FIG. 7 is a flowchart for explaining the calibration operation.

First, when the calibration operation is instructed by an external command (step S11: YES), the control signal ACT1 is activated, and the counter 134 included in the calibration circuit 130 starts a count operation (step S12). In the initialization state after the power supply is turned on, the count value of the counter 134 is all reset to 1 ("11111" in this example). Therefore, the inductance control signals DRZQP1 to DRZQP5 are all at the high level. Consequently, the transistors 311 to 315 that are included in the pull-up circuit 131 are all in the off state. As a result, the comparison signal COMP1 that is the output of the comparator 136 is at the low level.

Therefore, the counter 134 continues counting down. The on/off state of the transistors 311 to 315 is switched over linked to the count down. Specifically, because the W/L ratios of the transistors 311 to 315 are set to "1", "2", "4", "8", and "16", respectively, the least significant bit (LSB) of the counter 134 is allocated to the impedance control signal DRZQP1, and the most significant bit (MSB) of the counter 134 is allocated to the impedance control signal DRZQP5. With this arrangement, the impedance of the pull-up circuit 131 can be changed at a minimum pitch.

When the count down continues, the impedance of the pull-up circuit 131 gradually decreases, and the potential of the calibration pin ZQ gradually increases. When the impedance of the pull-up circuit 131 decreases to less than ho target impedance 240Ω, the potential of the calibration pin ZQ exceeds the intermediate voltage (VDD/2). Therefore, the comparison signal COMP1 that is output from the comparator 136 is inverted to a high level. In response to this, the counter 134 continues counting up, thereby increasing the impedance of the pull-up circuit 131 this time.

By repeating this operation, the potential of the calibration pin ZQ is stabilized near the intermediate voltage (VDD/2). Thereafter, the control signal ACT1 is inactivated, thereby stopping the count operation of the counter 134 (step S13). As a result, the count value of the counter 134 is fixed, and the levels of the impedance control signals DRZQP1 to DRZQP5 are firmed.

Based on the above operation, the impedances of the pull-up circuits 131 and 132 are adjusted to 240Ω. In this case, the initial value of the counter 134 can be a set value of 240Ω, instead of all one, and this value can be adjusted by counting up or counting down according to the level of the comparison signal COMP1.

The control signal ACT2 is then activated, thereby starting the count operation of the counter 135 included in the calibration circuit 130 (step S14). In the initial state, the count value of the counter 135 is reset to all one ("00000" in this example), as an example. Therefore, the impedance control signals DRZQP1 to DRZQP5 that are output from the counter 135 are all at the low level. Consequently, the transistors 321 to 325 included in the pull-down circuit 133 are all in the off state. As a result, the comparison signal COMP2 that is output from the comparator 137 becomes at a high level.

In response to this, the counter 135 continues the count up. The on/off state of the transistors 321 to 325 is switched over linked to this count up. In this case, the W/L ratios of the transistors 321 to 325 are set to "1", "2", "4", "8", and "16", respectively. Corresponding to these W/L ratios, the least significant bit (LSB) of the counter 135 is allocated to the impedance control signal DRZQN1, and the most significant bit (MSB) of the counter 135 is allocated to the impedance control signal DRZQN5. With this arrangement, the impedance of the pull-down circuit 133 can be changed at a minimum pitch.

Figure 9:
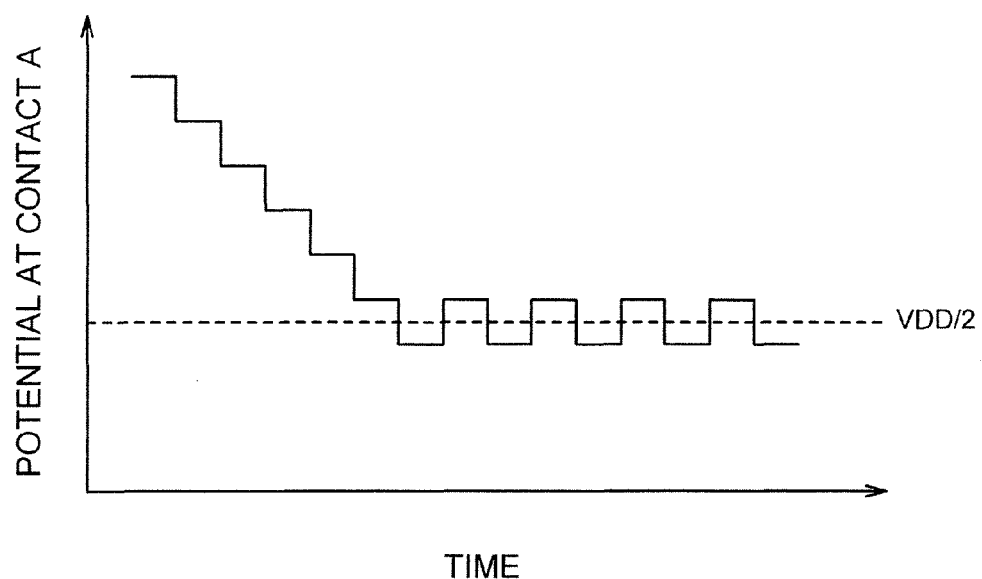
FIG. 9 is a graph showing a change of potential at the contact during the calibration operation.

When the count up continues, the impedance of the pull-down circuit 133 gradually decreases, and as shown in FIG. 9, the potential of the contact A gradually decreases. When the impedance of the pull-down circuit 133 decreases to less than the target impedance 240Ω, the potential of the contact A becomes lower than the intermediate voltage (VDD/2).

Therefore, the comparison signal COMP2 that is output from the comparator 137 is inverted to a low level. In response to this, the counter 135 continues the count down, thereby increasing the impedance of the pull-down circuit 133 this time.

By repeating this operation, the potential of the contact point A is stabilized near the intermediate voltage (VDD/2). Thereafter, the control signal ACT2 is inactivated, thereby stopping the count operation of the counter 135 (step S15). As a result, the count value of the counter 135 is fixed, and the levels of the impedance control signals DRZQN1 to DRZQN5 are firmed.

Based on the above operation, the impedance of the pull-down circuit 133 is also adjusted to 240Ω. In this case, the initial value of the counter 135 can be a set value of 240Ω, instead of all one, and this value can be adjusted by counting up or counting down according to the level of the comparison signal COMP2.

The process returns to step S11, and the instruction for the calibration operation based on an external command is awaited. When the calibration operation is instructed (step S11: YES), the above series of operation is carried out again.

The above is the calibration operation. The impedance control signal DRZQ that is firmed by the calibration operation is supplied in common to the pre-stage circuits 161 to 163 shown in FIG. 1. Therefore, the unit buffers 111 to 113 and 121 to 123 that are controlled by the pre-stage circuits 161 to 163 can also operate accurately in the impedance of 240Ω. In other words, the plurality of unit buffers can be collectively calibrated. The data output operation and the ODT operation will be explained next.

The data output operation and the ODT operation need to be executed after the above calibration operation is carried out at least once. With this arrangement, the unit buffers can operate at the correct impedance.

The data output operation is carried out via an external bus (not shown) connected to the data pin DQ, by driving the data pin DQ at a high level or a low level.

When the data pin DQ is driven at a high level, the output control circuit 150 sets all selection signals 151P to 153P and 151N to 153N to a low level. With this arrangement, out of OR circuits included in the pre-stage circuits 161 to 163 in FIG. 6, the OR circuits in which the corresponding impedance control signals DRZQP1 to DRZQP5 are at the low level output operation signals of a low level, and the OR circuits in which the corresponding impedance control signals DRZQP1 to DRZQP5 are at the high level output operation signals of a high level.

On the other hand, AND circuits included in the pre-stage circuits 161 to 163 all output the operation signals of a low level, regardless of the levels of the impedance control signals DRZQN1 to DRZQN5. As a result, the pull-up circuits PUs included in the unit buffers 111 to 113 and 121 to 123 are turned on at the same impedance 240Ω as that of the pull-up circuits 131 and 132 that are included in the calibration circuit 130, and the pull-down circuits PDs are all turned off. Namely, all the pull-up circuits PUs included in the six unit buffers 111 to 113 and 121 to 123 are accurately turned on at 240Ω. Therefore, the data pin DQ is driven accurately in the impedance of 40Ω (=240Ω/6) at a high level (VDD potential).

Similarly, when the data pin DQ is driven at a low level, the output control circuit 150 sets all the selection signals 151P to 153P and 151N to 153N to a high level as shown in FIG. 10. With this arrangement, out of AND circuits included in the pre-stage circuits 161 to 163 shown in FIG. 6, the AND circuits in which the corresponding impedance control signals DRZQN1 to DRZQN5 are at the low level output operation signals of a low level, and the AND circuits in which the corresponding impedance control signals DRZQN1 to DRZQN5 are at the high level output operation signals of a high level.

On the other hand, OR circuits included in the pre-stage circuits 161 to 163 all output the operation signals of a high level, regardless of the levels of the impedance control signals DRZQP1 to DRZQP5. As a result, the pull-down circuits PDs included in the unit buffers 111 to 113 and 121 to 123 are turned off at the same impedance 240Ω as that of the pull-down circuit 133 that is included in the calibration circuit 130, and the pull-up circuits PUs are all turned off. Accordingly, all the pull-down circuits PDs included in the six unit buffers 111 to 113 and 121 to 123 are accurately turned on at 240Ω. Therefore, the data pin DQ is driven accurately in the impedance of 40Ω (=240Ω/6) at a low level (GND potential).

On the other hand, the impedance in the ODT operation is often required to be switched to plural kinds of impedances, depending on specifications. The output circuit 100 according to this embodiment meets this requirement, and can be set to at least any one of 120Ω and 240Ω.

First, in carrying out the ODT operation at 120Ω, the output control circuit 150 sets the selection signals 151P, 152N, and 153P to a high level, and sets the selection signals 151N, 152P, and 153N to a low level, as shown in FIG. 10. As a result, the operation signals 161P, 161N, 163P, and 163N that are output from the pre-stage circuits 161 and 163 are used to turn off all the transistors included in the unit buffers 111 to 113 and 123, thereby setting the unit buffers 111 to 113 and 123 to an inactive state. On the other hand, the operation signals 162P (162P1 to 162P5) and 162N (162N1 to 162N5) that are output from the pre-stage circuit 162 coincide with the levels of the corresponding impedance control signals DRZQP1 to DRZQP5 and DRZQN1 to DRZQN5.

As a result, the pull-up circuits PUs included in the unit buffers 121 and 122 are turned on at the same impedance 240Ω as that of the pull-up circuits 131 and 132 that are included in the calibration circuit 130, and the pull-down circuits PDs are turned on at the same impedance 240Ω as that of the pull-down circuit 133 that is included in the calibration circuit 130. Therefore, the data pin DQ is terminated accurately in the impedance of 120Ω (=240Ω)/2) at a VDD/2 potential.

In carrying out the ODT operation at 240Ω, the output control circuit 150 sets the selection signals 151P, 152P, and 153N to a high level, and sets the selection signals 151N, 152N, and 153P to a low level, as shown in FIG. 10. As a result, the operation signals 161P, 161N, 162P, and 162N that are output from the pre-stage circuits 161 and 162 are used to turn off all the transistors included in the unit buffers 111 to 113, 121, and 122, thereby setting the unit buffers 111 to 113, 121, and 122 to an inactive state. On the other hand, the operation signals 163P (163P1 to 163P5) and 163N (163N1 to 163N5) that are output from the pre-stage circuit 163 coincide with the levels of the corresponding impedance control signals DRZQP1 to DRZQP5 and DRZQN1 to DRZQN5.

As a result, the pull-up circuits PUs included in the unit buffer 123 is turned on at the same impedance 240Ω as that of the pull-up circuits 131 and 132 that are included in the calibration circuit 130, and the pull-down circuits PDs are turned on at the same impedance 240Ω as that of the pull-down circuit 133 that is included in the calibration circuit 130. Therefore, the data pin DQ is terminated accurately in the impedance of 240Ω at a VDD/2 potential.

When the ODT operation of 80Ω is necessary based on the specification, for example, all the unit buffers 121 to 123 can be activated.

As explained above, the output circuit 100 according to this embodiment has the plural unit buffers 111 to 113 and 121 to 123, having mutually the same circuit structures, connected in parallel, and selects a unit buffer that is activated at the data output time or the ODT operation time. With this arrangement, the output circuit 100 adjusts the impedance of the data pin DQ. Therefore, the calibration circuit 130 can collectively carry out the calibrations. Consequently, the calibration circuit to be used to adjust the impedance at the data output time and the calibration circuit to be used to adjust the impedance at the ODT time are not separately required. As a result, the circuit scale of the calibration circuit can be decreased.

Because adjustment of impedance at the data output time, and adjustment of impedance at the ODT time can be simultaneously completed based on the one-time calibration, the time required for the calibration can be decreased. Therefore, even when the calibration is periodically executed at the actual use time, the overhead of the calibration can be minimized.

The present invention is in no way limited to the aforementioned embodiments, but rather various modifications are possible within the scope of the invention as recited in the claims, and naturally these modifications are included within the scope of the invention.

For example, the output circuit 100 according to this embodiment has six unit buffers. At the time of carrying out the data output operation, all the six unit buffers are activated, and at the time of carrying out the ODT operation, one or two unit buffers are activated. However, the total number of unit buffers is not particularly limited when the total number is at least two. The number of unit buffers that are activated at the data output time or the ODT operation time is not particularly limited either.

In the output circuit 100 according to this embodiment, each of the three unit buffers 111 to 113 that constitute the first output buffer 110 has an independent circuit. Similarly, each of the two unit buffers 121 and 122 that constitute the second output buffer 120 also has an independent circuit. However, these circuits do not need to be completely independent of each other. So long as individual unit buffers can be regarded as the same as a replica buffer, these unit buffers can be mutually connected within the output buffer, as shown in FIG. 11.

Figure 11:
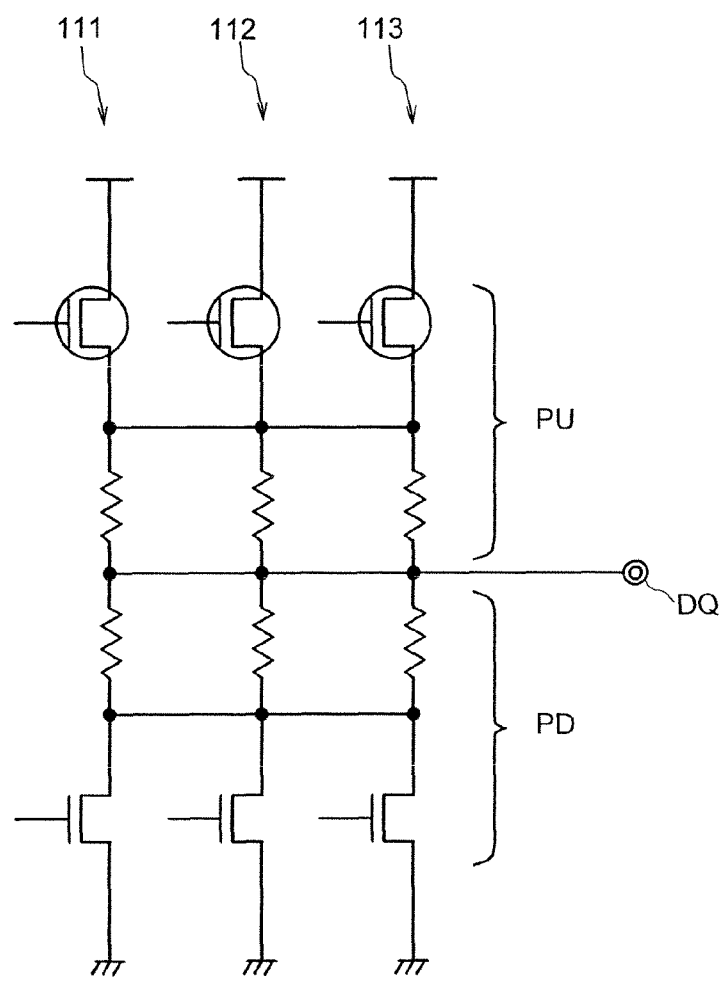
FIG. 11 is a circuit diagram showing an example of a mutual connection of the unit buffers inside the circuit.

FIG. 11 shows the three unit buffers 111 to 113 that constitute the first output buffer 110, and that are connected to each other inside the first output buffer 110. In this example, the P-channel MOS transistor that is included in the pull-up circuit PU and the contact of the resistor are connected to each other. The N-channel MOS transistor that is included in the pull-down circuit PD and the contact of the resistor are connected to each other. In this case, the individual unit buffers 111 to 113 are regarded as the same as a replica buffer. Therefore, in the present invention, the "parallel connection of unit buffers" also includes this case.

What is claimed is:

1. A method comprising:
adjusting a plurality of unit buffers provided in a device, the device being further provided with a first terminal coupled in common to the unit buffers and a second terminal configured to be coupled to a resistive element that is indicative of first impedance, each of the unit buffers including a first driving unit that drives, when activated, the first terminal to a first logic level and a second driving unit that drives, when activated, the first terminal to a second logic level different from the first logic level,
the adjusting including performing first and second adjustment operations, the first adjustment operation being carried out to cause impedance of the first driving unit of each of the unit buffer to become second impedance that is substantially equal to the first impedance, and the second adjustment operation being carried out to cause impedance of a second driving unit of each of the unit buffers to become third impedance that is substantially equal to the second impedance;
activating one of the first and the second driving units of first selected one or ones of the unit buffers when the device is in a first operation mode; and
activating the first and second driving units of second selected one or ones of the unit buffers when the device is in a second operation mode.

2. The method as claimed in claim 1, wherein at least one of the unit buffers serves as both of one of the first selected one or ones of the unit buffers and one of the second selected one or ones of the unit buffers.

3. The method as claimed in claim 1, wherein at least one or more buffers of the first selected one or ones of the unit buffers are different from the second selected one or ones of the unit buffers.

4. The method as claimed in claim 1, wherein the first selected one or ones of the unit buffers are equal in number to the second selected one or ones of the unit buffers.

5. The method as claimed in claim 1, wherein the first selected one or ones of the unit buffers are different in number from the second selected one or ones of the unit buffers.

6. The method as claimed in claim 1, wherein the first operation mode is used to output a data signal at the first terminal and the second operation mode is used for an ODT.

7. The method as claimed in claim 1, wherein the second adjustment operation is carried out after the first adjustment operation has been carried out.

* * * * *